Sept. 3, 1963 B. N. LOCANTHI 3,102,984

SINGLE-ENDED PUSH-PULL TRANSISTOR AMPLIFIER

Filed March 25, 1960

BART N. LOCANTHI,
INVENTOR.

BY
Barkelew & Lewis

United States Patent Office 3,102,984
Patented Sept. 3, 1963

3,102,984

SINGLE-ENDED PUSH-PULL TRANSISTOR AMPLIFIER

Bart N. Locanthi, Altadena, Calif., assignor to Computer Engineering Associates, Inc., Pasadena, Calif., a corporation of California Filed Mar. 25, 1960, Ser. No. 17,560
2 Claims. (Cl. 330—14)

Figures 1, 2:
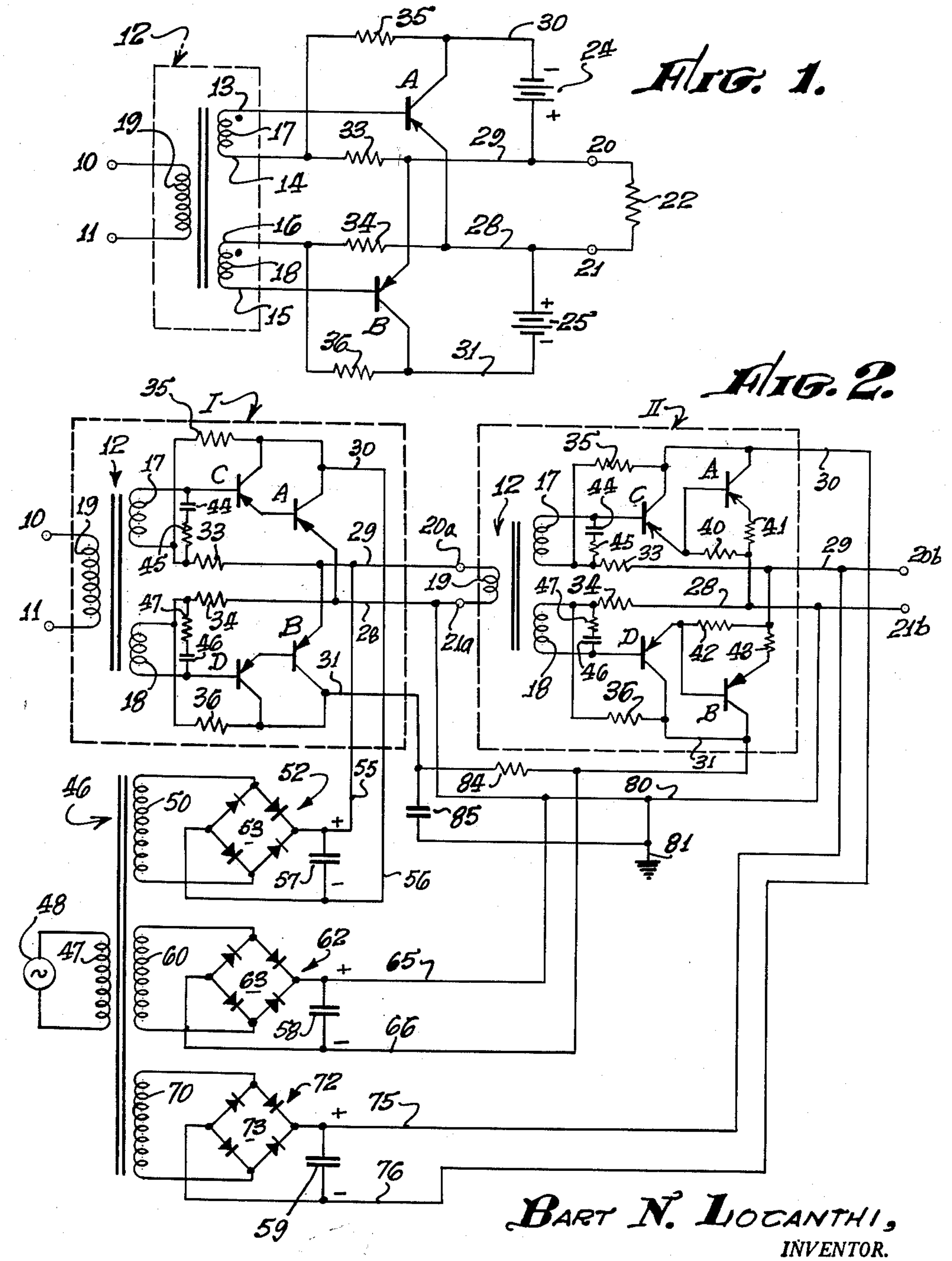

This invention has to do with transistor amplifiers of push-pull type, and is concerned especially with the reduction of distortion in such amplifiers. More particularly, the invention relates to single-ended push-pull amplifiers of common collector configuration.

The amplifiers of the invention are particularly useful for amplifying relatively low frequencies, including those commonly referred to as audio frequencies, and operate well at frequencies approaching the alpha-cutoff of the transistors employed.

In such amplifiers it is known that common collector stages provide relatively low distortion, due to the negative feedback inherent in the emitted-follower action of such stages. Push-pull stages of common collector configuration have been described, but such previously available circuits have significant disadvantages which limit their utility.

One group of such known circuits employs one transistor of PNP type and one of NPN type. That use of complementary transistors in the two branches of the push-pull circuit provides complementary symmetry which has well-known characteristics. However, the potential advantages of such circuits are limited in practice by the fact that transistors of complementary type do not actually behave in strictly symmetrical fashion, and it is therefore impossible to obtain perfect matching between the two branches of the circuit.

Common collector amplifying stages of another known group use transistors of like type, but are incapable of driving a simple two-terminal load impedance. Such circuits must be provided with a load device of special construction that provides a center tap or its equivalent. That not only limits the applicability of such circuits. It also seriously impairs their performance, since output power is supplied to only one half of the total load impedance at a time. If, for example, that impedance comprises the voice coil of a loudspeaker, the required duplication of windings approximately doubles the mass of the voice coil, affecting its dynamic characteristics; and also typically doubles the sectional area of the coil, impairing its magnetic coupling with the field. Use of a tapped output transformer or autotransformer also involves well known practical disadvantages, especially when faithful reproduction is required.

An important object of the present invention is to provide a single-ended push-pull amplifier stage of common collector configuration which avoids those disadvantages and operates with low distortion.

Amplifiers in accordance with the invention are well adapted for use as output or power stages of a multi-stage amplifier. They are useful for a wide variety of purposes, especially since they may be operated with either one of the output terminals grounded, or with ungrounded output. The amplifiers of the invention are especially effective for driving loudspeakers or other transducers of conventional design with high efficiency and without compromise of quality of reproduction.

Further, I have found that the distortion within one amplifying stage in accordance with the invention is typically so low, even at relatively high power levels, that it is difficult or impossible to drive it from a preceding amplifying stage of conventional type without introducing distortion that is distinctly greater than that inherently present. That difficulty may be overcome by utilizing a plurality of my improved stages in series. Transformer coupling can be employed effectively between such stages, since the power level is low compared to the final output power. Distortion in the resulting multi-stage amplifier is typically so remarkably low that feedback between stages can be entirely dispensed with. The overall circuit is therefore comparatively simple and straightforward to design and build; is clean and reliable in operation; and gives remarkably faithful reproduction.

A further important advantage of the present circuit is that the reverse potential between base and emitter is automatically held to a low value. It is therefore feasible to employ transistors of special types, such as diffusion-base transistors, for example, which are subject to damage when exposed to larger values of reverse base-to-emitter potential.

A still further advantage of the invention is that, when an input transformer is used, desirable close coupling can be maintained between its secondary windings without introducing effective input capacitance. The relatively high mutual capacitance of bifilar-wound secondaries, for example, is virtually ineffective to limit high frequency response because the potential signal between adjacent turns of the two windings is approximately zero.

Even with transistors that are not precisely matched, and without compensating circuit adjustments, the circuit of the invention holds the direct current unbalance of the output to approximately one half of the difference in emitter-to-base potentials that would be required to make the two transistor currents equal.

A full understanding of the invention, and of its further objects and advantages, will be had from the following description of certain illustrative manners in which it may be carried out. The particulars of that description, of which the accompanying drawings form a part, are intended only as illustration, and not as a limitation upon the scope of the invention, which is defined by the appended claims.

In the drawings:

FIG. 1 is a schematic drawing, representing an illustrative amplifying stage in accordance with the invention; and FIG. 2 is a schematic drawing, representing an illustrative multi-stage amplifier.

As typically shown in FIG. 1, two input terminals are represented at 10 and 11, with input coupling means indicated generally by the numeral 12. Coupling means 12 may be of any type that provides two electrically isolated signals of equal amplitude and opposite phase for supply to the two branches of the circuit. In the present embodiment coupling means 12 comprises an input transformer having a single primary winding 19 connected between input terminals 10 and 11, and having two equal secondary windings 17 and 18. When terminal 13 of winding 17 is negative, say, with respect to its other terminal, terminal 15 of winding 18 is positive. The two secondary windings are preferably closely coupled together, as by the known technique of bifilar winding.

Output terminals for the amplifying stage of FIG. 1 are shown at 20 and 21, with a load impedance, represented schematically as the resistance 22, connected between them. Two sources of direct current power are represented illustratively as the batteries 24 and 25. Two transistors of like type, typically PNP, are represented schematically at A and B. The emitter of transistor A is connected via the line 28 to output terminal 21, and its collector is connected via the line 30 and battery 24 to output terminal 20. Similarly, transistor B has its emitter connected via the line 29 to output terminal 20, and its collector connected via the line 31 and battery 25 to output terminal 21. The batteries are connected in suitable polarity to operate the type of transistors used. For driving PNP transistors, as shown, the positive side of each battery is connected to an output terminal and the negative side to a transistor collector. For operation with NPN transistors, both power supplies would be reversed.

With the described connections, if transistor A, for example, is conductive, current from the positive side of battery 24 flows through load impedance 22 from terminal 20 to 21, through the transistor from emtiter to collector, and back to the negative terminal of battery 24. Similarly, if transistor B is conductive, current from the positive terminal of battery 25 flows through the load from terminal 21 to 20, through transistor B from emitter to collector, and back to the negative terminal of battery 25. If those two currents are equal, the net current in the load is zero, and a single current may be considered to flow in the closed path that includes in series, battery 24, transistor B, battery 25, and transistor A. Any inequality in current through the two transistors produces a net current in the load in one direction or the other, depending upon which of the two transistors conducts more strongly.

The entire system may float with respect to ground, if desired. Alternatively, either of the output terminals may be operated at a selected fixed potential, such as ground, for example, the other terminal and its associated power source floating on the load. Ordinarily, it is advantageous for one side of the load to be so grounded, particularly in an output stage.

Control signals are supplied to the transistors A and B from the respective transformer secondary windings 17 and 18. As illustrated, terminal 13 of winding 17 is connected to the base of transistor A, and its other terminal 14 is connected via line 29 to output terminal 20 and thence through load 22 to the emitter of transistor A. Similarly, winding 18 has its terminal 15 connected to the base of transistor B, and its other terminal 16 connected via line 28 to output terminal 21 and thence through the load to the emitter of transistor B.

The desired operating points for the transistors may be established, if necessary, in any suitable manner. As illustrated, a suitable bias is supplied to the base of each transistor by means of a voltage dividing network connected in shunt to the associated battery 24 or 25. For transistor A, that network comprises the relatively low resistance 33, which is inserted between transformer winding 17 and line 29, and the relatively high resistance 35, which is connected between the negative terminal of battery 24 and the junction of resistance 33 and winding 17. In the biasing circuit for transistor B, resistance 34 is inserted between winding 18 and line 28, and resistance 36 is connected between the negative side of battery 25 and the junction of resistance 34 and winding 18. The ratio of the value of resistors 35 and 36 to that of resistors 33 and 34 is selected to provide suitable bias at zero input signal. In general, the higher that ratio, the the more closely the stage approximates class B operation. When the system operates as close as is practicable to class B, I have found that the distortion at full power is extremely low. Distortion at intermediate levels may be improved by shifting the operation slightly toward class A. A satisfactory compromise can ordinarily be obtained when the described ratio for the biasing resistors has a value in the range from 100 to 200, for example. It is desirable to keep resistors 33 and 34 as low as possible compared to the input impedance of the transistors, to keep the insertion loss down. In practice, a satisfactory compromise can readily be made between that objective and holding to a reasonable value the power lost in the voltage divider circuits.

As an illustrative example, in a power stage utilizing PNP power transistors of conventional type that conduct approximately 3 amperes at signal peaks, I have found it satisfactory to set the base bias so that the current at zero signal is approximately 150 milliamperes. That is typically accomplished, with supply voltage of 20 volts, for example, if bias resistances 33 and 34 are about 3 ohms and resistances 35 and 36 are of the order of 400 ohms.

Secondary windings 17 and 18 of the input transformer are preferably arranged with tight coupling between them, as by being bifilar wound. An important advantage of the invention is that such bifilar winding does not lead to large effective input capacitance, as might be expected. That is, because adjacent turns of such bifilar windings do not differ appreciably in potential even in presence of a large input signal. The potential between winding terminals 13 and 16, for example, is substantially equal to the base-to-emitter potential of transistor A, since the voltage drop across bias resistor 34 is small. During the half-cycle for which winding terminals 13 and 16 are negative with respect to terminals 14 and 15, for example, transistor A is conductive and its base-to-emitter potential is low, being typically of the order of 1 volt. That is only a small fraction of the maximum signal voltage, which is approximately 10 volts for a typical load of 4 ohms and a power transistor of the type described above. The potential difference between terminals 13 and 16, is a correspondingly low fraction of the signal voltage. The same is true for all other corresponding points of the bifilar windings, since the input signal affects both windings equally. During the opposite half-cycle of the signal, the two windings are similarly held at closely equal potentials by the low base-to-emitter potential of conductive transistor B.

The action just described provides the further advantage that the base-to-emitter voltage of the transistor that is not conducting is held to a low value, and therefore is not subject to the high reverse potential that is characteristic of many conventional circuits. That control is exercised for example during the non-conductive phase of transistor B, for example, via the circuit that extends from the base of transistor B via winding 18, bias resistance 34, the emitter and base of transistor A, winding 17, and bias resistance 33 to the emitter of transistor B. In that circuit the voltage drops in resistances 33 and 34 are inherently small, that in transistor A is small during its conductive phase, and the voltages in windings 17 and 18 are equal and opposite. Since the transistors are effectively protected from appreciable reverse base-to-emitter potentials, the circuit is particularly suitable for use with transistors that are sensitive to such potentials, such, for example, as diffusion-base transitsors which have superior high frequency characteristics.

FIG. 2 represents an illustrative multi-stage amplifier in accordance with the invention, comprising input stage I and output stage II. The components within each stage are shown for illustration in the same basic arrangement as in FIG. 1, with corresponding components identified by the same numerals. In addition, however, FIG. 2 illustrates several additional features of the invention which lead to improved operation or flexibility of the system. Input terminals 10 and 11 and input coupling transformer 12 in stage I act also as input terminals and transformer for the entire amplifier. Output terminals 20*a* and 21*a* of stage I may be considered as input terminals for stage II. Output terminals 20*b* and 21*b* of stage II act as output terminals for the entire amplifier, and may be connected to any suitable load, not shown. Additional stages may be provided as required. Coupling between the stages is provided by the input transformer 12 of stage II, which is designed to provide the desired voltage gain between stages in the usual way.

It is particularly noteworthy that the overall distortion of a plurality of stages in accordance with the invention is typically so low that negative feedback between stages is ordinarily not required. However, a moderate amount of such feedback is sometimes helpful, and may be provided in conventional manner.

A particularly effective and convenient type of direct current power supply system is illustrated in FIG. 2, comprising a plurality of electrically isolated power supply circuits 52, 62 and 72.

Those power circuits typically comprise respective rectifying means 53, 63 and 73, shown as full-wave bridge rectifiers of conventional form, powered by respective secondary windings 50, 60 and 70 of a power transformer 46. Transformer 46 has a primary winding 47, which is supplied with alternating current power of suitable voltage and frequency from a source indicated schematically at 48. The direct current power from rectifier 53 is taken on the relatively positive and negative lines 55 and 56, respectively; from rectifier 63 on the lines 65 and 66; and from rectifier 73 on the lines 75 and 76. Suitable filtering networks are provided for each supply, indicated illustratively as the filter capacitors 57, 58 and 59, connected in shunt to the respective rectifying circuits.

One of the channels of stage I, shown as channel A, is powered from supply 52, as by connection of supply lines 55 and 56 to lines 29 and 30, respectively, of stage I. Channel A of stage II is similarly powered from supply 72, as by connection of power lines 75 and 76 to the respective lines 29 and 30 of stage II.

On the other hand, channel B of stage I and channel B of stage II are powered from the common supply 62. That is made possible by the freedom of choice, already described, whereby one of the output terminals of each stage may be operated at fixed potential if desired. In the present circuit, output terminal 21*a* of stage I and the output terminal 21*b* of stage II are operated at a common potential, being connected together via the line 80. That line may be grounded, as at 81, if desired. Positive power line 65 from source 62 is connected directly to line 80. Negative power line 66 is connected to line 31 of stage I and also to line 31 of stage II, suitable circuit means being provided to regulate the voltage supplied to each stage if required. For example, the voltage dropping resistor 84 may be inserted between power line 66 and line 31 of stage I. Additional filtering may be provided for channel B of stage I, as indicated by the filter capacitor 85, which is connected between line 31 of that stage and line 80.

In the circuit of FIG. 1 the input capacitance of transistors A and B is sometimes great enough to burden the input circuits, particularly at relatively high frequencies and when transistors of large power handling capacities are used. Under such conditions the input transformer 12 is preferably buffered from the transistor input capacitance by inserting smaller transistors in the respective input branches of the push-pull circuit. Such buffering or driving transistors are shown at C and D in FIG. 2, receiving as input the signals from transformer 12 and delivering their outputs to the respective bases of transistors A and B. Since relatively little power is required from driving transistors C and D, they may be selected to have reduced input capacitance, greatly improving the performance of the system at higher frequencies. Driving transistor C, for example, has its base connected to transformer winding 17, its emitter to the base of transistor A, and its collector to power line 30.

It is usually desirable to make transformer 12 as small physically as possible, which in general means a fairly large number of turns per volt for the transformer windings, tending to increase the leakage inductance between the primary and secondary windings. That leakage inductance tends to cause resonance even with the relatively small input capacitance of driving transistors C and D. If the resonance frequency lies within the desired range of operation of the amplifier a resonant peak tends to appear in the amplifier response. Under such conditions I have found that it is desirable to provide a filter network that will damp the input signal at frequencies adjacent the resonance frequency. With such a filter the high frequency response of the circuit may be maintained substantially flat out to and somewhat beyond the resonant frequency just defined.

Such a filter circuit is shown illustratively in both stages of the amplifier of FIG. 2. It comprises the capacitor 44 and resistance 45 series connected in shunt to secondary winding 17; and capacitor 46 and resistor 47 connected in shunt to winding 18. Resistors 45 and 47 are typically approximately equal to the square root of the ratio of the leakage inductance appearing at the transformer secondary to the input capacitance of the transistor. Capacitors 44 and 46 are typically selected to have a reactance of the order of ½ to ⅓ of the series resistance 45 and 47 at the natural frequency of the resonance to be controlled. In practice, since the two secondary windings of the transformer 12 are preferably tightly coupled, as already explained, effective filtering in both branches of the circuit may be provided by a single filter circuit connected in one branch. Thus, for example, components 46 and 47 may be omitted, components 44 and 45 being selected accordingly.

A further feature of the invention, illustrated in stage II of the amplifier of FIG. 2, separately protects each of the output transistors A and B from any tendency to run away simultaneously at the same rate, due to elevated temperature, for example. A protective biasing network for that purpose typically comprises the resistors 40 and 41 in branch A and resistors 42 and 43 in branch B. Resistors 41 and 43 are connected in series with the emitters of transistors A and B, respectively, and are selected to provide sufficient bias to control thermal runaway under the conditions of operation for which the system is designed. A resistance value of the order of 5 to 10% of the load resistance at the output of the amplifier is ordinarily sufficient for that purpose and involves a satisfactorily small power loss. Resistor 40 is connected between the base of transistor A and the junction of resistor 41 and output line 28; and resistor 42 is similarly connected in branch B. The value of those resistors is selected to provide adequate conduction to remove minority carriers and cut off the transistor during periods of zero signal. At the same time, resistors 40 and 41 are preferably made large compared to the load resistance at terminals 20*b* and 21*b* to avoid burdening the transistor input to any appreciable extent. The impedance looking in to the base of transistor A, for example, substantially corresponds to beta times the sum of the load resistance and resistance 40, in parallel with beta times resistance 41, where beta stands for the current gain of the transistor. With suitable values for resistors 40 and 41 that input impedance does not differ greatly from its normal value. For a load resistance of about 4 ohms, for example, satisfactory protective action is obtained when resistors 41 and 43 are approximately ¼ ohm and resistors 40 and 42 approximately 20 to 30 ohms.

A protective network equivalent to that shown in stage II may be provided also in stage I, if desired, as well as in a single stage amplifier such as that of FIG. 1. Many further modifications may be made in the circuits that have been described without departing from the proper scope of the invention, which is defined in the appended claims.

I claim:

1. A single-ended push-pull transistor amplifier, comprising in combination two transistors of like type, having respective emitters, collectors and bases, two sources of direct current power, two output terminals for connection to a load of predetermined impedance, circuit means connecting the emitter of one transistor through a first series resistance to one output terminal and connecting the collector of said transistor in series with one power source to the other output terminal, circuit means connecting the emitter of the other transistor through a second series resistance to said other output terminal and connecting the collector of said other transistor in series with the other power source to said one output terminal, a first shunting resistance connected between the base of said one transistor and said one output terminal, a second shunting resistance connected between the base of said other transistor and said other output terminal, an input transformer having a primary winding and two secondary windings, circuit means connecting one secondary winding between the base of said one transistor and said other output terminal, and circuit means connecting the other secondary winding between the base of said other transistor and said one output terminal, said series resistances being small compared to the load impedance and said shunt resistances being large compared to the load impedance.

2. A multiple-stage transistor amplifier, each stage of said amplifier comprising first and second transistors of like type having respective emitters, collectors and bases and connected in single-ended push-pull common collector configuration, a single output impedance for each stage being connected in series with the collector-emitter circuit of the first transistor of that stage to form a first output circuit and being connected in series with the collector-emitter circuit of the second transistor of that stage to form a second output circuit, a common source of direct current power, a plurality of sources of direct current power electrically isolated from each other and from said common source, circuit means for supplying power from said common source in parallel as operating potential to all of said first output circuits, and circuit means for supplying power separately from said plurality of power sources as operating potential to said respective second output circuits.

References Cited in the file of this patent

UNITED STATES PATENTS

| | | |
|---|---|---|
| 2,663,830 | Oliver | Dec. 22, 1953 |
| 2,747,455 | Spracklen et al. | May 29, 1956 |
| 2,762,870 | Sziklai | Sept. 11, 1956 |
| 2,780,683 | Hanson | Feb. 5, 1957 |
| 2,864,904 | Jensen | Dec. 16, 1958 |
| 2,877,310 | Donald | Mar. 10, 1959 |
| 2,897,378 | Jones | July 28, 1959 |
| 2,932,800 | Bereskin | Apr. 12, 1960 |

OTHER REFERENCES

Transistor Products Pamphlet, "Power Transistors Circuit Design and Data," March 1954, pages 1–5.